United States Patent [19]

Savoye et al.

[11] Patent Number: 4,547,957
[45] Date of Patent: Oct. 22, 1985

[54] IMAGING DEVICE HAVING IMPROVED HIGH TEMPERATURE PERFORMANCE

[75] Inventors: Eugene D. Savoye, Lancaster; Charles M. Tomasetti, Leola, both of Pa.

[73] Assignee: RCA Corporation, Princeton, N.J.

[21] Appl. No.: 636,562

[22] Filed: Aug. 1, 1984

Related U.S. Application Data

[63] Continuation-in-part of Ser. No. 387,365, Jun. 11, 1982, abandoned.

[51] Int. Cl.⁴ .................. H01L 31/18; H01L 27/14
[52] U.S. Cl. .................. 29/572; 313/367; 357/31; 148/DIG. 24; 148/DIG. 60; 148/DIG. 172
[58] Field of Search .............. 357/31; 313/367, 368; 29/572; 148/DIG. 24, DIG. 60, DIG. 172

[56] References Cited

U.S. PATENT DOCUMENTS

| Re. 29,261 | 6/1977 | Kostelec | 357/31 |
|---|---|---|---|
| 3,403,284 | 9/1968 | Buck et al. | 315/11 |
| 3,548,233 | 12/1970 | Cave et al. | 313/65 |
| 3,649,889 | 3/1972 | Hart | 317/235 R |
| 3,676,727 | 7/1972 | Dalton et al. | 313/367 |
| 3,717,790 | 2/1973 | Dalton et al. | 148/1.5 |
| 3,828,232 | 8/1974 | Horiike et al. | 357/31 |
| 3,883,769 | 5/1975 | Finnila | 313/367 |
| 3,916,509 | 11/1975 | Hoeberechts et al. | 29/578 |
| 4,021,844 | 5/1977 | Gilles et al. | 357/31 |
| 4,232,245 | 11/1980 | Savoye et al. | 313/367 |

OTHER PUBLICATIONS

"Theory, Design, and Performance of Low-Blooming Silicon Diode Array Imaging Targets", by B. M. Singer et al., *IEEE Transactions on Electron Devices*, vol. ED-21, No. 1, Jan. 1974, pp. 84–89.
"Ion Implantation Basics", by E. C. Douglas et al., RCA Technical Report, PRRL-72-TR-100, Abstract and p. 24, Jun. 26, 1972.

*Primary Examiner*—Brian E. Hearn
*Assistant Examiner*—Alan E. Schiavelli
*Attorney, Agent, or Firm*—Eugene M. Whitacre; Dennis H. Irlbeck; Vincent J. Coughlin, Jr.

[57] ABSTRACT

An imaging device includes a wafer of single crystal semiconductor material having a first surface with an input surfacing region which extends into the wafer from the first surface and a second surface with a charge storage portion which includes a plurality of discrete charge storing regions which extend into the wafer of the second surface. The wafer includes a potential barrier within the input signal sensing portion for controlling blooming. The wafer is improved by including a passivation region within the input sensing portion for stabilizing the energy level of the conductivity band of the minority carriers at the Fermi energy level of the semiconductor wafer. Additionally, an electrical leakage reduction region extends into the wafer from the second surface. The leakage reduction region is contiguous with each of the discrete charge storage regions.

8 Claims, 5 Drawing Figures

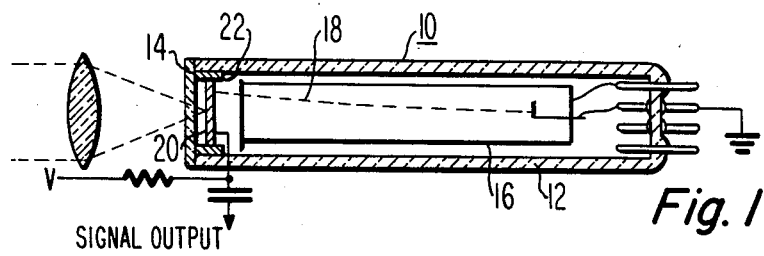
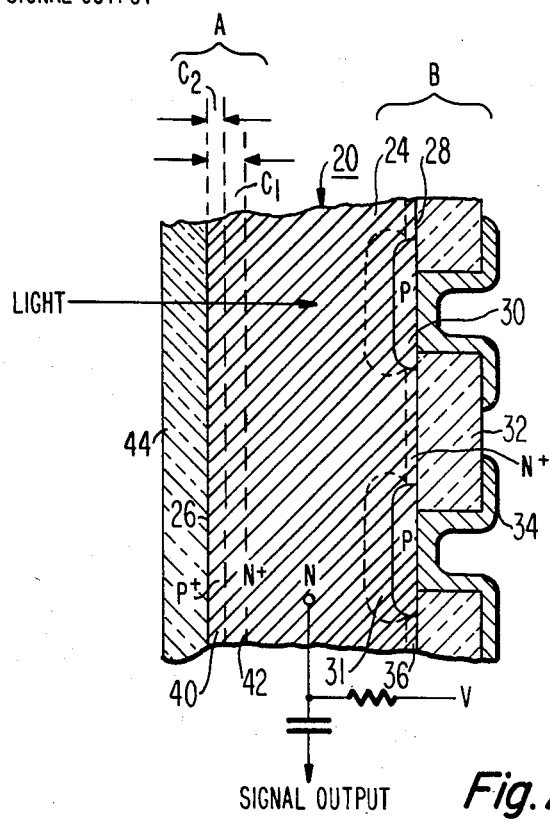
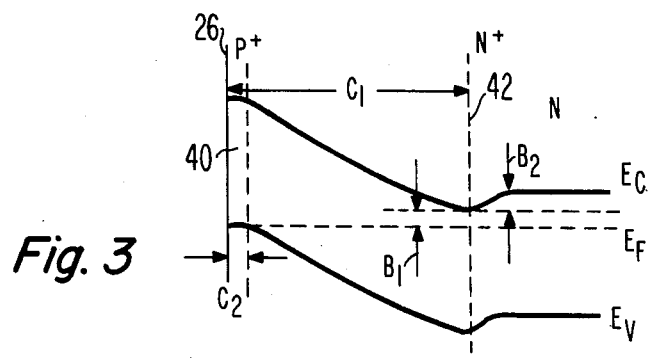

IMAGING DEVICE HAVING IMPROVED HIGH TEMPERATURE PERFORMANCE

This is a continuation-in-part of application Ser. No. 387,365, filed June 11, 1982, now abandoned.

BACKGROUND OF THE INVENTION

The invention relates to an imaging device incorporating a single crystal semiconductor wafer and more particularly to a device having improved performance at about 65 degrees centigrade.

Imaging devices such as silicon vidicons and silicon intensifier tubes employ sensing elements or targets consisting of single crystal semiconductor wafers. The operation of such sensing elements in these devices is well known in the art. Such an imaging device is described in U.S. Pat. No. 4,232,245 issued to Savoye et al. on Nov. 4, 1980 and incorporated by reference herein for the purpose of disclosure. This patent describes an imaging device having a silicon target with reduced blooming.

The target element in the Savoye et al. patent comprises a wafer of semiconducting material doped to have an N− type conductivity, with one of the major surfaces of the wafer being selectively doped to have a large plurality of P− type conductivity regions, respective ones of the regions forming junction diode with the substrate thereunder. The substrate is maintained at a potential which is positive with respect to a scanning electron beam so that as the P− type conductivity regions are bombarded with electrons they become reversed biased. In the reversed biased state, each of the junction diodes stores an electric charge of electrons derived from the beam and maintains that charge at least until it is scanned again. The reverse bias maintained on the junction diodes in the target element and the charges stored in the diodes create a "depletion region" in the substrate under each diode that also extends between adjacent diodes. These depletion regions are characterised by a shortages of majority carriers (electrons in the case of an N− type conductivity material) and by an electron field across the depletion region.

In normal operation, the surface of the target opposite the aforementioned diodes, which is hereinafter referred to as the well-side of the target, receives light from an image. Photons striking the target cause the creation of electron-hole pairs to be generated in the substrate. A substantial number of holes, which are thus generated, reach the diode opposite the point of photon impact where they combine with and hence eliminate a corresponding number of stored electrons.

The holes generated in the substrate migrate through the body of the target until they reach the depletion region, where they are rapidly swept into the nearest diode by the electric field existing across the depletion region. In this manner a charge pattern is created in the diodes corresponding to the image striking the well-side of the target, with each of the diodes having its stored charge reduced by an amount corresponding to the time integral of the light striking the corresponding spot on the well-side of the target.

One problem associated with the operation of such silicon targets is commonly referred to as "blooming". "Blooming" occurs when the silicon target is exposed to a relatively high intensity point source of light in a relatively low light level background. Under these conditions, the number of holes generated as a result of the point light source is greater than the charge storing capacity of the corresponding diodes in the target. As a result, when less than all of the generated holes have discharged the diodes directly opposite the point of light impact, the remaining holes spread laterally through the target substrate and are swept into the nearest adjacent diodes, tending to discharge them as well. This lateral spreading of holes has the tendency of discharging too many diodes and is manifested by a relatively large, bright image having a size that increases with the intensity of the point light source. The Savoye et al. patent reduces blooming by forming a potential barrier with a controlled energy level configuration spaced from the well-side of the target. This potential barrier in normal operation allows a limited number of holes to penetrate to the well-side of the target and then recombine, thereby maximizing the sensitivity of the device by permitting the greater majority of excited minority carriers, or holes, to diffuse towards the charge storage region of the wafer. However, in the case of the generation of excess carriers by overexcitation at localized regions (normally associated with the blooming conditions previously described) the excess carriers accumulate at and overcome the potential barrier. These excess carriers are swept to the well-side of the target where they quickly recombine due to the substantially increased recombination velocity along that surface, thereby avoiding lateral diffusion to neighboring diodes in the charge storage region of the target.

A second limitation of the junction diode target is that it tends to have a leakage current, also called a dark current, which discharges the reverse biased diodes even in the absence of light. Principally, leakage currents are caused by the flow of minority carriers (e.g., holes in an N− type substrate) from the substrate into the P− type conductivity diode regions where they recombine with, and hence eliminate, electrons stored therein. Such leakage currents are known to be caused by the generation of electron-hole pairs in the body of the target element at particular sites called "generation-recombination centers" which occur where there is a defect or impurity in the semiconductor substrate, where there is a transition between differently doped areas in the material, and where the substrate interfaces with another material. The leakage current herein described may be either voltage dependent or temperature dependent.

The voltage dependency of the dark current is discussed in U.S. Pat. No. 3,717,790 issued to Dalton et al. on Feb. 20, 1973. In the Dalton et al. patent, voltage dependent leakage is viewed as being generated on the diode side of the target, specifically at the silicon-silicon oxide interface and the patent only addresses a solution to diode side leakage. Likewise, U.S. Pat. No. 3,828,232 issued to Horiike et al. on Aug. 6, 1974 and U.S. Pat. No. 3,883,769 issued to Finnila on May 13, 1975 limit their investigation of target related problems to the diode side of the target. The aforementioned dark current leakage is generally a phenomena which affects a large portion or all of the diodes so that a generally uniform increase in target dark current occurs. Certain types of leakage, however, are manifest as localized disturbances and are frequently seen as cosmetic defects, e.g., intense white spots. Such defects occur when locally generated holes discharge one or more adjacent diodes without affecting other diodes in the array. Such defects may be either voltage related and/or temperature related.

In many camera tube applications it is necessary to operate the camera tube at elevated temperatures in the neighborhood of 65° C. Unfortunately, many tubes which operate acceptably at lower operating temperatures (within the range of 23° C. to 40° C.) fail at an elevated temperature approaching 65° C. Such a failure occurs from the generation of temperature dependent defects. These defects are believed to arise principally, but not exclusively, from local sites at the well-side surface of the silicon target and are thus not effectively treated by the leakage reduction techniques described in the aforementioned patents which consider only diode side leakage.

SUMMARY OF THE INVENTION

An imaging device includes a wafer of single crystal semiconductor material having a first surface with an input signal sensing portion which extends into the wafer from the first surface and a second surface with a charge storage portion which includes a plurality of discrete charge storing regions which extend into the wafer from the second surface. The wafer includes means within the input signal sensing portion for controlling blooming. The wafer is improved by including a passivation region within the input sensing portion for stabilizing the energy level of the conductivity band of the minority carriers at the Fermi energy level of the semiconductor wafer. Additionally, electrical leakage reduction means extend into the wafer from the second surface. The leakage reduction means is contiguous with each of the discrete charge storage regions.

BRIEF DESCRIPTION OF THE DRAWINGS

FIG. 1 is a longitudinal sectional view of an improved vidicon camera tube utilizing the present invention.

FIG. 2 is an enlarged fragmentary sectional view of a silicon target suitable for use in the tube of FIG. 1.

FIG. 3 is a band diagram showing the energy level configuration in the region of the input signal sensing portion of the target shown in FIG. 2.

BRIEF DESCRIPTION OF THE PREFERRED EMBODIMENT

Figure 4:
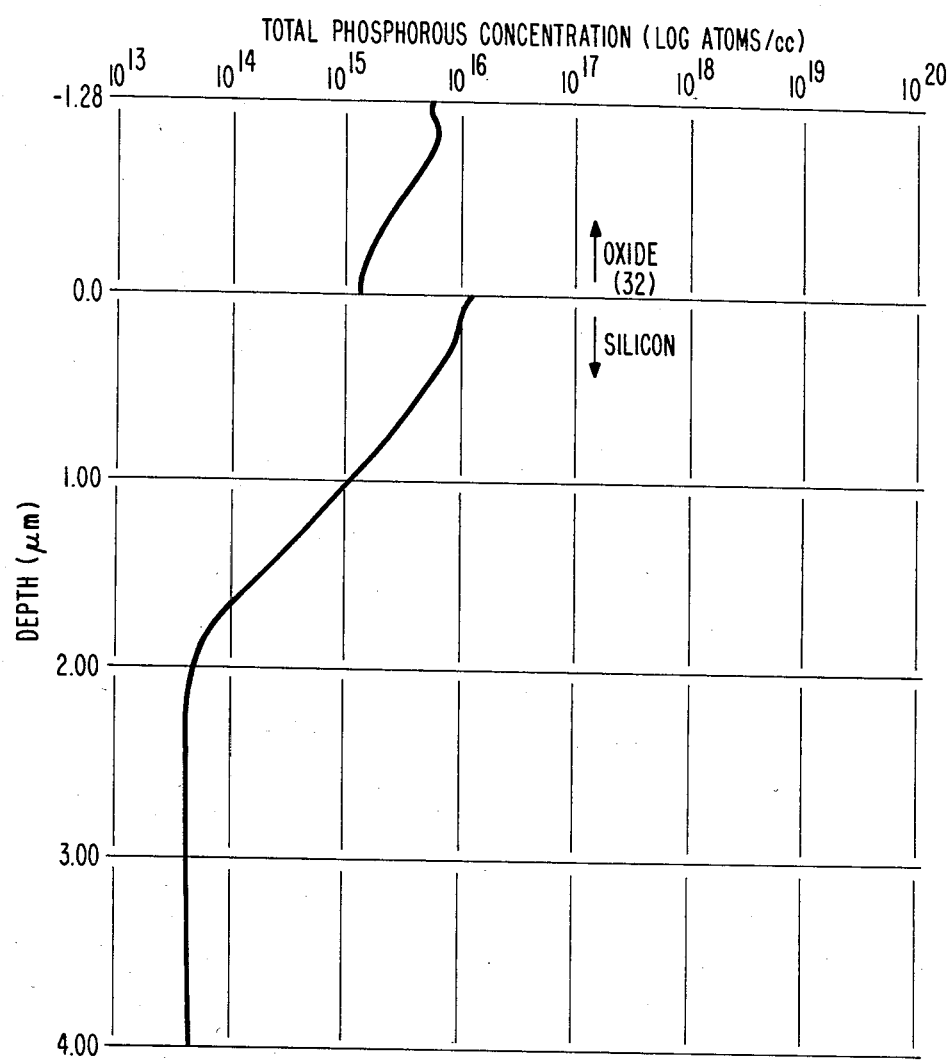
FIG. 4 is a graph showing the dopant concentration as a function of depth for the leakage reduction means in the charge storage portion of the target shown in FIG. 2.

A preferred embodiment of a novel imaging device is a vidicon camera tube 10, as shown in FIG. 1, having an evacuated envelope 12 with a transparent faceplate 14 at one end of the envelope 12 and including an electron gun assembly 16 inside the envelope 12 for forming a low velocity electron beam 18. A photo-excitable target 20 comprising a wafer of single crystal semiconductor material is mounted on a support spacer 22 and is positioned adjacent the inside surface of the faceplate 14 in a manner suitable for receiving a light input image signal. Means (not shown) for magnetically focusing the beam 18 toward the target 20 and for causing the beam 18 to scan the surface of the target 20 may be disposed outside the envelope 12.

The photon-excitable target 20, a fragment of which is shown in FIG. 2, is a wafer-shaped silicon photodiode target having an N− type conductivity bulk region 24 of a single crystal of elemental silicon with first and second opposed major surfaces 26 and 28, respectively. The first major surface 26, also known as the well-side surface, comprises the input signal sensing surface of the target 20 for receiving an input light image. The second major surface 28 faces the electron gun assembly 16 when mounted in the tube of FIG. 1, and is commonly referred to as the scan surface or diode side portion of the target 20. The target 20 includes a charge storage portion "B" along a section including the scan surface 28, and an input surface portion "A" along a section including the input signal sensing surface 26. The charge storage portion "B" includes on the scan surface 28 of the silicon wafer 24, an array of discrete "PN" junction storage diodes 30. A depletion region 31 associated with each of the diodes 30 extends into the bulk 24. The extent of the depletion region 31 depends on the reverse bias condition of the diode. An insulating layer 32 of silicon dioxide is provided on the scan surface 28 between the discrete diodes 30 to shield the bulk region 24 from the effect of the scanning electron beam 18. Contact pads 34 of P− type silicon are provided which cover the P− type surfaces of the discrete diode 30 and overlap the insulating layer 32 about the periphery of the diode 30 in a manner well known in the art. Such pads improve the contact of the scanning beam 18 with the diodes 30. An N+ region 36, which extends into the wafer 24 from the second major surface 28, is provided for reasons to be discussed hereinafter.

Along the input surface portion "A", extending from the input signal sensing surface 26 into the bulk 24 of the silicon target 20, there is provided an energy level configuration of the wafer 24 such as that shown in FIG. 3. A shallow P+ region 40 is provided along the input signal sensing surface 26 to a depth $C_2$ to effectively fix the valance band $E_v$ in that region of the target 20 substantially at the Fermi level, $E_f$, and an N+ potential barrier 42 is provided a distance $C_1$ from the signal sensing surface 26 for accomplishing blooming control. $C_1$ represents the distance from the surface 26 to the peak or maximum of the N+ distribution. The N+ potential barrier 42 is preferably located such that $C_1$ is about 600 Å. The distribution of the doping profile in the region of the N+ potential barrier 42 reltive to the N− type bulk 24 of the silicon target 20, should have the characteristic ($B_1$ and $B_2$) necessary for achieving the blooming reduction mechanism described in "Theory, Design, and Performance of Low-Blooming Silicon Diode Array Imaging Targets" by B. M. Singer et al. in IEEE Transactions on Electron Devices, volume ED-21, pages 84–89, January 1974, herein incorporated by reference.

FABRICATION

In general, the fabrication of single crystals semiconductor sensing elements of, for example, silicon are well known in the art. A suitable silicon wafer target 20 having Miller indices of (111) and a resistivity of 50 to 150 ohm-centimeter bulk material with approximately $5 \times 10^{13}$ carrier per cubic centimeter may be processed in the following manner. A capping oxide (not shown) is formed by heating the wafer at a temperature of 800° for 2.5 hours in a dry oxygen atmosphere. The resultant capping oxide has a thickness of approximately 300 angstroms. An N+ region 36 is implanted into the wafer through the capping oxide from the second major surface 28 of the wafer by using phosphorous of arsenic atoms with an incident energy ranging between about 25 to 250 KeV, however, an energy of about 175 KeV is preferred. A dosage of about $1 \times 10^{12}$ atoms per square centimeter provides a concentration at the surface 28 of about $1 \times 10^{16}$ atoms per cc. The dosage may range from about $1 \times 10^{11}$ to about $1 \times 10^{13}$ atoms per square centimeter providing a concentration at the surface 28 ranging from $1 \times 10^{15}$ to about $1 \times 10^{17}$ atoms per cc. These atoms are activated, for example, by heating or annealing the wafer in a furnace at a temperature ranging from about 800° to about 1050° centigrade for 180 minutes to 30 minutes, although a temperature of about 1000° centigrade in a predominantly nitrogen atmosphere with a trace of oxygen for a period of time of about 30 minutes is preferred. It is believed that the implanting and annealing steps create generation-recombination centers and cause the migration of impurities from within the bulk of the wafer into the capping oxide where the impurities are trapped.

After the wafer has been cooled to room temperature, the capping oxide is removed by a buffered HF acid etch. The N+ concentration decreases, as shown in FIG. 4 to about $4.6 \times 10^{13}$ phosphorous atoms per cc at a distance of about 1.8 to about 2 um into the wafer. If arsenic atoms are implanted at the same dose and implant energy to form the N+ region 36, the N+ region only extends to a depth of about 0.2 um into the wafer at which point the arsenic concentration approaches the concentration of the bulk region 24.

The wafer 20 is then steam oxidized at about 1100° C. for about 4 hours to form the oxide layer 32 on both major surfaces. A plurality of apertures are etched into the second major surface 28 of the wafer and the junction diodes 30, previously described herein, are formed in a manner disclosed in U.S. Pat. No. 3,548,233 issued to E. F. Cave et al. on Dec. 15, 1970 and herein incorporated by reference. The details of construction of the charge storage junction diodes 30 may be varied considerably without affecting the relevance of the instant invention. Additional processing of the wafer, including thinning, is carried out in a method well known in the art.

The silicon target 20 is now ion implanted with a suitable doping source to include the N+ potential barrier 42 previously described. The N+ potential barrier is injected through the first major surface 26 on the well-side surface with the desired doping profile for controlling blooming using arsenic atoms with an energy of about 70 KeV. A dosage of about $4 \times 10^{12}$ to about $1.4 \times 10^{13}$ atoms per square centimeter may be utilized and a dosage of about $1.2 \times 10^{13}$ is preferred. The arsenic atoms are activated by heating or annealing the wafer in a furnace having a 3:1 nitrogen to oxygen atmosphere at a temperature of about 800° C. for about 45 minutes. After such annealing, an effective active doping level of about $2.7 \times 10^{18}$ atoms per cc is achieved at the peak of the resultant potential barrier distribution (about 600 Å from the first surface 26) by atoms which have become substitutional in the lattice for achieving the blooming control mechanism previously described.

The target 20 is further processed to include a shallow P− type region or P− skin 40 which extends from the first surface 26 into the target between the first surface and the previously implanted N+ potential barrier 42. The P− skin 40 is formed using a boron nitride source to form a boron glass which is deposited on the surface 26 of the target 20. The desired surface concentration is about $1.1 \times 10^{20}$ boron atoms per cc.

Figure 5:
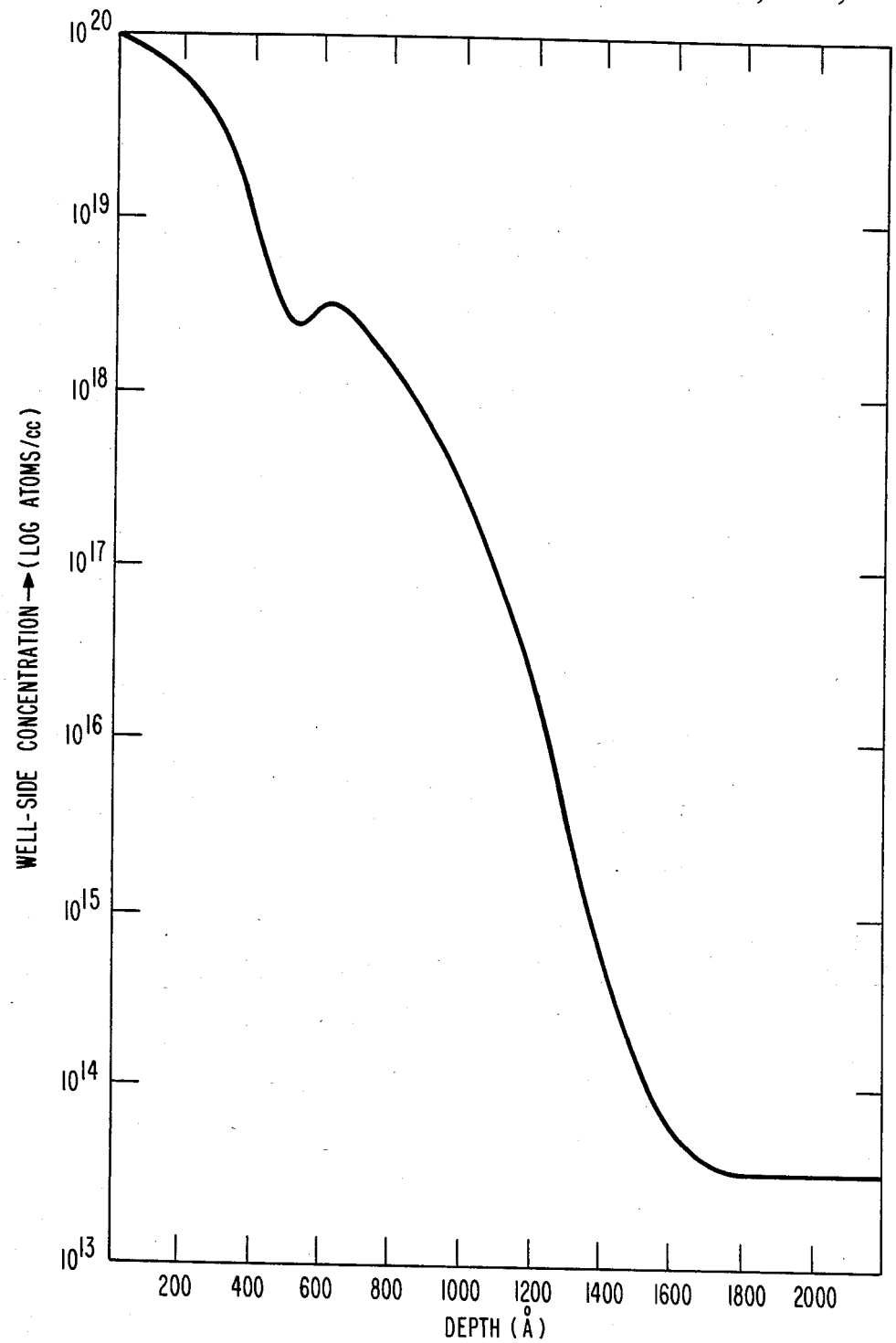
FIG. 5 is a graph showing the dopant concentration as a function of depth in the signal sensing portion of the target shown in FIG. 2.

The boron is diffused into the target by heating the target at a temperature of 875° C. for about 5 minutes in a substantially inert, e.g., helium, atmosphere. The boron diffuses to a depth of about 500 Å. The preferred method for the deposition is to position a pair of targets in a deposition boat (not shown) and locate a pair of boron nitride wafers (also not shown) on either side of the targets and to deposit boron glass onto the target surfaces. In addition to depositing the boron glass on the well-side of the target it has been noted that some boron glass is also found on the diode side of the target. This may be an effective means of sealing off pin-hole defects in the steam oxidized insulating layer 32 that was previously formed on the second surface 28 of the wafer 20. Next, the glass is stripped from the wafer and the wafer is cleaned to provide a pristine surface. Then the wafer is hydrogen-fired at 500° C. for about 20 minutes. The doping profile of the P− skin 40 and the N+ potential barrier 42 is shown in FIG. 5. The change in slope of the concentration curve at about 500 Å indicates a change from P− type conductivity to N− type conductivity.

It has been determined that the parameters of arsenic implant energy, dosage and anneal temperature to form the N+ potential barrier 42 as well as the boron doping concentration and anneal temperature to form the P− skin 40 may be varied within limits without significantly affecting the performance of the target 20. The arsenic implant energy to form the N+ barrier 42 may range from 30 KeV to about 200 KeV with an arsenic dosage variation from about $1 \times 10^{15}$ to about $1 \times 10^{10}$ atoms per square centimeter, respectively. To form the P− skin 40, the boron concentration may range from about $1 \times 10^{18}$ to about $5 \times 10^{20}$ atoms per cubic centimeter.

To increase the quantum efficiency of the imaging device, an anti-reflective coating 44 may be deposited on the well-side surface 26 of the target 20. A preferred coating is zirconium oxide which is deposited to an optical thickness of about 1200 angstroms.

Alternatively, the P− skin 40 may be formed by implanting either boron fluorides or boron. If, for example, the N+ potential barrier 42 is formed by implanting arsenic at an energy of 70 KeV at a dosage of $1.2 \times 10^{13}$ atoms per square centimeter, boron fluoride may be implanted at an energy of 5 KeV with a dosage ranging from about $7 \times 10^{13}$ to about $7 \times 10^{14}$ atoms per square centimeter. A single anneal at a temperature of about 850° C. for 45 minutes in an atmosphere of 3:1 nitrogen and oxygen follows the implant steps. Other techniques for shallow doping of boron or other elements to form the P− skin 40 may also be utilized and are within the scope of this invention.

THEORY OF OPERATION

In order to improve the high temperature operating characteristics of the silicon target 20 used in this type of imaging device, it is necessary to minimize the contributions to the dark current that occurs on the diode side of the target, within the bulk of the target, and from the well-side of the target. Previous attempts to minimize silicon target leakage have concentrated on the diode side of the target and have ignored the contributions from the bulk and from the well-side of the target. It is therefore necessary to provide a structure which will simultaneously eliminate leakage from the silicon-silicon oxide interface between adjacent diodes, getter impurities in the bulk which provide recombination-generation sites within the target, and also prevent minority carriers generated at localized sites on the well-side of the target from reaching the PN junctions 30 on the diode side of the target. To eliminate leakage from the silicon-silicon oxide interface an N+ region 36 is formed by the implantation of phosphorous atoms through the capping oxide (not shown) into the diode side of the target. The depth of the N+ region 36 is less than or approximately equal to the depth of the PN junctions 30, hence the diode junctions interface longitudinally with the N— type material of the bulk 24 and not with the N+ material from the leakage reduction region 36. By having the leakage reduction N+ region 36 extend a distance of less than or equal to the interface between the P— type material of the diode and the N— type material of the bulk 24, an additional region or interface between materials of different conductivity is eliminated and leakage in the bulk is not further increased. Additionally, the implantation of phosphorous atoms getters impurities in the bulk 24 as described herein. The N+ region 36 in the present structure laterally contacts the adjacent diodes 30 so as to minimize any surface generated leakage that occurs at the silicon-slicon oxide interface 28. While the aforementioned Horiike et al. and Finnila patents disclose an N+ region between adjacent diodes, the N+ region does not fully extend between the sides of the adjacent diodes and thus some surface area exists between the silicon-silicon oxide interface for the production of holes which may be attacted to neighboring diodes and cause leakage. In combination with the aforementioned N+ region 36 on the diode side of the target, a P— skin 40 is utilized on the well-side of the target 20 to suppress the contribution to leakage from localized sites on the well-side surface 26. In prior art targets operated at elevated temperatures, the minority carriers (holes) from the localized sites on the well-side 26 have sufficient energy to overcome the potential barrier 42 which previously has been implanted, and migrate to some of the diodes 30 thereby causing cosmetic defects such as "white spots". Applicants have discovered that by a judicious selection of the concentration of the P— type conductivity material, such as boron, deposited on the well-side of the target 20, and by raising the height, i.e., the potential of the barrier 42, holes from localized sites on the well-side of the target cannot overcome the potential barrier 42. It has been determined that the arsenic dose which creates the N+ potential barrier in the input surface region "A" of the wafer must be at about 4–6 times greater than the dosage used to create the potential barrier in the above described Savoye et al. patent.

The above-described process for forming the P— skin 40 and the potential barrier 42 provides a target 20 having greater uniformity, i.e., greater freedom from localized sites on the well-side, improved operational stability over a wide temperature range, and a greater degree of manufacturing reproducibility. Additionally, the present target 20 does not require the use of vycor glass on the input surface, as described in the Savoye et al. patent, so the sensitivity of the target 20 is improved over prior art targets.

While the target 20 is described in a vidicon camera tube embodiment, the invention is not limiting and the target 20 may be used, e.g., in a silicon intensifier tube where photoelectrons, rather than photons, are incident on the well-side of the target. Also, the inventor is not limited to N— type silicon of (111) orientation as those skilled in the art will realize. Furthermore, while arsenic and phosphorous are disclosed to be two elements that have been used to form the N+ region 36, antimony may also be used.

What is claimed is:

1. A method of making an imaging device having improved high temperature performance comprising the steps of:
    preparing a silicon wafer of a first type conductivity, said wafer having first and second major surfaces;
    forming a capping oxide on at least said second major surface of said wafer;
    introducing an element through said capping oxide into said second major surface of said wafer so as to form a region of enhanced first type conductivity contiguous with said second major surface of said wafer;
    annealing said wafer at an elevated temperature and thereafter
    removing said capping oxide from said wafer;
    forming an insulating layer on said second major surface of said wafer;
    providing a plurality of apertures through said insulating layer;
    forming a plurality of regions of a second type conductivity through said apertures, said second type conductivity regions extending into said wafer from said second surface a distance greater than said region of enhanced first type conductivity;
    introducing an element into said first major surface of said wafer so as to form a region of enhanced first type conductivity for controlling blooming, said region being spaced from said first major surface;
    activating said introduced element by heating said wafer at an elevated temperature; and
    forming a shallow region of a second type conductivity extending into said wafer from said first major surface for a distance less than said region of enhanced first type conductivity for controlling blooming, said shallow region of second type conductivity and said region of enhanced first type conductivity for controlling blooming acting in combination to prevent minority carriers from localized sites on the first major surface of the wafer from reaching said regions of second type conductivity extending into said wafer from the second major surface thereof.

2. A method of making an imaging device having improved high temperature performance comprising the steps of:
    preparing a silicon wafer of a N— type conductivity, said wafer having first and second major surfaces;
    growing a capping oxide having a thickness of about 300 Å on said second major surface of said wafer;
    implanting through said capping oxide an element selected from the group consisting of phosphorous and arsenic into said second surface of said wafer so as to form a region of N+ type conductivity contiguous with said second major surface of said wafer;
    annealing said wafer at an elevated temperature and thereafter
    removing said capping oxide from said second major surface of said wafer;
    forming an insulating layer on said second major surface of said wafer;
    etching a plurality of apertures through said insulating layer;
    forming a plurality of regions of a P— type conductivity through said apertures, said P— type conductivity regions extending into said wafer from said second major surface a distance greater than said region of N+ type conductivity;

implanting arsenic into said first major surface of said wafer so as to form a potential barrier comprising a region of N+ type conductivity for controlling blooming, said region being spaced from said first major surface;

annealing said wafer to activate said arsenic atoms implanted into said first major surface; and forming a shallow region of P− type conductivity extending into said wafer from said first major surface for a distance less than said potential barrier, said shallow region of P− type conductivity and said potential barrier acting in combination to prevent holes from localized sites on the first major surface of the wafer from overcoming the potential barrier and reaching the P− type conductivity regions extending into said wafer from the second major surface thereof.

3. The method as in claim 2, wherein the element implanted through said capping oxide has an implant energy of about 175 KeV and a dosage of approximately $1.0 \times 10^{12}$ atoms per square centimeter.

4. The method as in claim 3, wherein phosphorous extends into said wafer about 18,000 to 20,000 Å from said second surface.

5. The method as in claim 3, wherein arsenic extends into said wafer about 2,000 Å from said second surface.

6. The method as in claim 2, wherein said arsenic implanted into said first surface of said wafer for controlling blooming has an implant energy of about 70 KeV and a dosage of approximately $1.2 \times 10^{13}$ atoms per square centimeter.

7. The method as in claim 2, wherein about $1.1 \times 10^{20}$ boron atoms per cubic centimeters are diffused into the first surface at a temperature of about 875° C. for about 5 minutes to provide a second type conductivity region extending into said wafer for about 500 Å.

8. The method as in claim 6, wherein boron fluoride is implanted into said first surface of said wafer at an implant energy of 5 KeV at a dosage ranging from about $7 \times 10^{13}$ to about $7 \times 10^{14}$ atoms per square centimeter, said wafer being annealed at a temperature of about 850° C. for 45 minutes following the implantation of said boron fluoride.

* * * * *